(12) United States Patent
Kim et al.

(10) Patent No.: US 12,740,449 B2
(45) Date of Patent: Sep. 15, 2026

(54) SEMICONDUCTOR DEVICES METHODS OF MANUFACTURING SEMICONDUCTOR DEVICES

(71) Applicant: Amkor Technology Singapore Holding Pte. Ltd., Singapore (SG)

(72) Inventors: Jae Yoon Kim, Gyeonggi-do (KR); Hee Jun Jang, Chungcheongbuk-do (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 341 days.

(21) Appl. No.: 18/233,036

(22) Filed: Aug. 11, 2023

(65) Prior Publication Data

US 2025/0054869 A1 Feb. 13, 2025

(51) Int. Cl.
*H10W 70/65* (2026.01)
*H10W 20/00* (2026.01)
(Continued)

(52) U.S. Cl.
CPC ......... *H10W 70/65* (2026.01); *H10W 20/023* (2026.01); *H10W 70/611* (2026.01); *H10W 74/01* (2026.01); *H10W 74/121* (2026.01)

(58) Field of Classification Search
CPC ............. H01L 23/5386; H01L 23/3135; H01L 23/3128; H01L 23/49816; H01L 23/5384;
(Continued)

(56) References Cited

U.S. PATENT DOCUMENTS 5,222,014 A 6/1993 Lin
6,448,506 B1 9/2002 Glenn et al.
(Continued)

FOREIGN PATENT DOCUMENTS

CN 103270587 A 8/2013

OTHER PUBLICATIONS

Office Action for China Application No. 202111184791.4 mailed May 7, 2026.

*Primary Examiner* — Marlon T Fletcher
*Assistant Examiner* — Christina A Sylvia
(74) *Attorney, Agent, or Firm* — Spectrum IP Law Group LLC

(57) ABSTRACT

In one example, an electronic device comprises a first and second substrates comprising first and second dielectric structures and first and second conductive structures, a first electronic component over the first substrate, the second substrate being over the first substrate and the first electronic component, a first interconnect structure between the first substrate and the second substrate and coupled with the first conductive structure and the second conductive structure, a first encapsulant between the first substrate and the second substrate and covering a lateral side of the first interconnect structure and a lateral side of the first electronic component, a second interconnect structure over the second substrate and coupled with the second conductive structure, a second encapsulant over the second substrate and covering a lateral side of the second interconnect structure, and a photonic integrated circuit over the second encapsulant and coupled with the second interconnect structure.

20 Claims, 7 Drawing Sheets

(51) Int. Cl.

| | |
|---|---|
| ***H10W 70/60*** | (2026.01) |
| ***H10W 74/01*** | (2026.01) |
| ***H10W 74/10*** | (2026.01) |

(58) Field of Classification Search

CPC ............. H01L 23/5385; H01L 23/5389; H01L 23/49833; H01L 23/3121; H01L 23/49811; H01L 23/49822; H01L 21/56; H01L 21/76898; H01L 21/561; H01L 21/6835; H01L 2221/68359; H01L 2221/68345; H01L 24/81; H10W 70/65; H10W 20/023; H10W 70/611; H10W 74/01; H10W 74/121; H10W 70/635; H10W 70/614; H10W 74/014; H10W 74/117; H10W 90/401; H10W 90/701; H10W 70/685; H10W 72/072; H10W 74/114; H10P 72/74; H10P 72/7424; H10P 72/743

See application file for complete search history.

(56) References Cited

U.S. PATENT DOCUMENTS

| | | | | |
|---|---|---|---|---|
| 11,482,496 | B2 | 10/2022 | Choi et al. | |
| 2016/0343688 | A1 | 11/2016 | Bang et al. | |
| 2017/0069607 | A1 | 3/2017 | Yap | |
| 2018/0152657 | A1 | 5/2018 | Miyazawa | |
| 2019/0103386 | A1 | 4/2019 | Chen et al. | |
| 2020/0003975 | A1 | 1/2020 | Yu et al. | |
| 2020/0219847 | A1 | 7/2020 | Yang et al. | |
| 2021/0091056 | A1 | 3/2021 | Yu et al. | |
| 2021/0096310 | A1* | 4/2021 | Chang | H01L 24/09 |
| 2021/0096311 | A1 | 4/2021 | Yu et al. | |
| 2021/0272930 | A1* | 9/2021 | Choi | H01L 23/5384 |
| 2021/0366802 | A1* | 11/2021 | Huang | H01L 25/167 |
| 2025/0167003 | A1* | 5/2025 | Bishop | H10P 14/412 |

* cited by examiner 100
132
131
130
121
120
122
1224
1324
1323
1223
1321
1221
1322
1222
115
111
110
180
191
190
150
170
140
160

SEMICONDUCTOR DEVICES METHODS OF MANUFACTURING SEMICONDUCTOR DEVICES

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 3A to 3J show cross-sectional views of an example method for manufacturing an example electronic device.

Figures 1, 2:
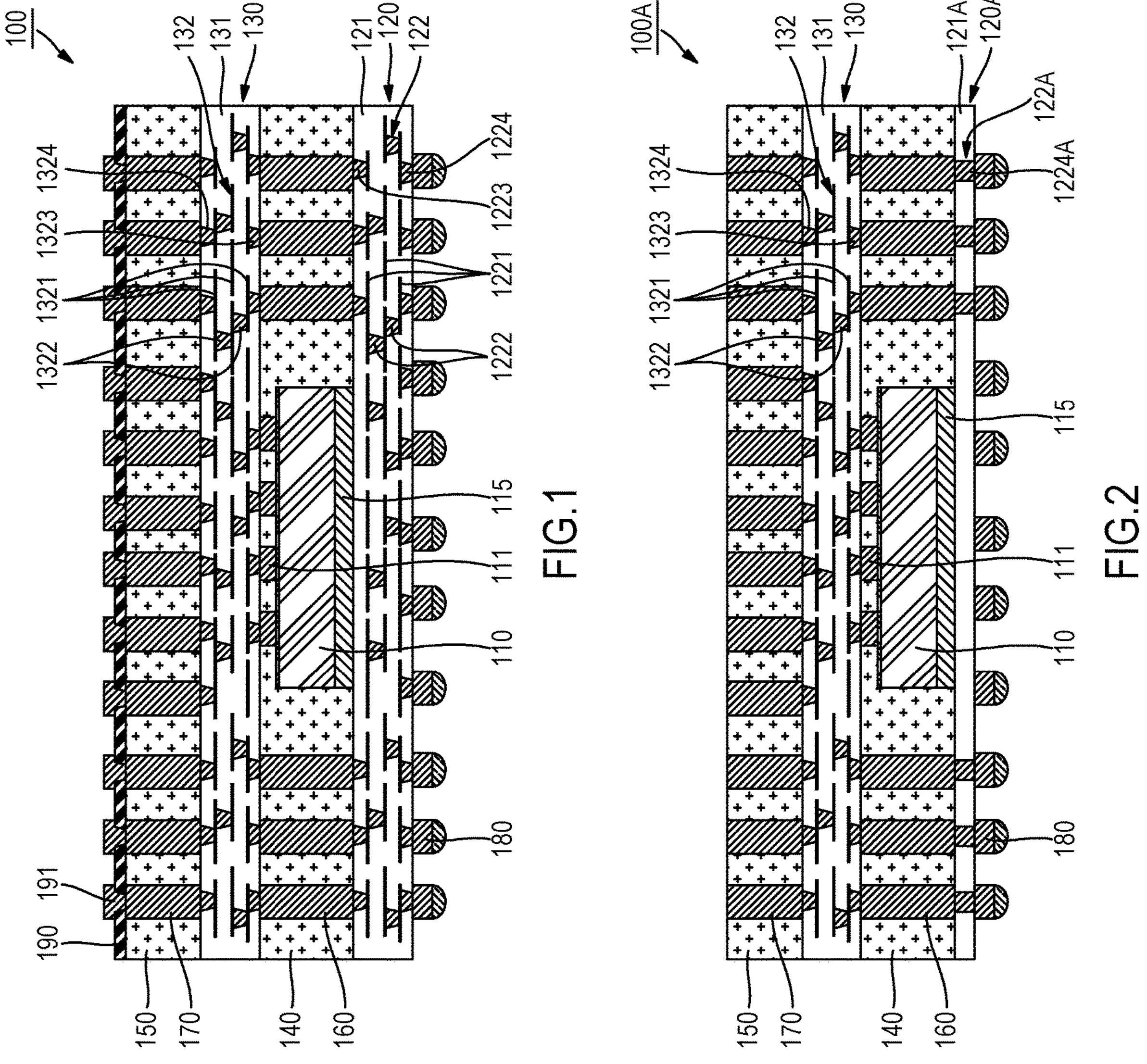
FIG. 1 shows a cross-sectional view of an example electronic device.
FIG. 2 shows a cross-sectional view of an example electronic device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," or "including," are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, an electronic device comprises a first substrate comprising a first dielectric structure and a first conductive structure, a first electronic component over the first substrate, a second substrate comprising a second dielectric structure and a second conductive structure, wherein the second substrate is over the first substrate and the first electronic component, a first interconnect structure between the first substrate and the second substrate, wherein the first interconnect structure is coupled with the first conductive structure and the second conductive structure, a first encapsulant between the first substrate and the second substrate and covering a lateral side of the first interconnect structure and a lateral side of the first electronic component, a second interconnect structure over the second substrate and coupled with the second conductive structure, a second encapsulant over the second substrate and covering a lateral side of the second interconnect structure, and a second electronic component over the second encapsulant, wherein the second electronic component is coupled with the second interconnect structure, and wherein the second electronic component comprises a photonic integrated circuit (PIC).

In another example, a method to manufacture an electronic component comprises providing a first substrate comprising a first dielectric structure and a first conductive structure, wherein the first conductive structure comprises an outward terminal, providing a first interconnect structure over the first substrate, wherein the first interconnect structure is coupled with the first conductive structure, providing a first electronic component over the first substrate, providing a first encapsulant over the first substrate and covering a lateral side of the first interconnect structure and a lateral side of the first electronic component, providing a second substrate comprising a second dielectric structure and a second conductive structure, wherein the second substrate is over the first substrate and the first electronic component, and the second conductive structure is coupled with the first interconnect structure, providing a second interconnect structure over the second substrate and coupled with the second conductive structure, providing a second encapsulant over the second substrate and covering a lateral side of the second interconnect structure, and providing a second electronic component over the second encapsulant. The second electronic component is coupled with the second interconnect structure, and the first encapsulant is between the first electronic component and the second substrate.

Other examples are included in the present disclosure. Such examples can be found in the figures, in the claims, or in the description of the present disclosure.

FIG. 1 shows a cross-sectional view of an example electronic device 100. In the example shown in FIG. 1, electronic device 100 can comprise electronic component 110, substrate 120, substrate 130, encapsulant 140, encapsulant 150, interconnect structure 160, interconnect structure 170, external interconnect 180, dielectric or dielectric structure 190 (optional), and metallization 191 (optional). In some examples, substrate 120, substrate 130, or both, can comprise redistribution layer (RDL) substrates or pre-formed substrates.

Electronic component 110 can comprise component interconnect 111 and component attach material 115. Substrate 120 can comprise dielectric structure 121 and conductive structure 122. Conductive structure 122 of substrate 120 can comprise trace 1221, via 1222, inward terminal 1223, and outward terminal 1224. Substrate 130 can comprise dielectric structure 131 and conductive structure 132. Conductive structure 132 of substrate 130 can comprise trace 1321, via 1322, inward terminal 1323, and outward terminal 1324. In some examples, electronic component 110 can be over substrate 120, and substrate 130 can be over substrate 120. In some examples, interconnect structure 160 can be between substrate 120 and substrate 130 and can be coupled with conductive structure 122 and conductive structure 132. In some examples, encapsulant 140 can be between substrate 120 and substrate 130 and can cover a lateral side of interconnect structure 160 or a lateral side of electronic component 110. In some examples, interconnect structure 170 can be over substrate 130 and can be coupled with conductive structure 132. In some examples, encapsulant 150 can be over substrate 130 and can cover a lateral side of interconnect structure 170. In some examples, encapsulant 140 can contain electronic component 110, and encapsulant 150 can be devoid of electronic components. In some examples, dielectric structure 121 or dielectric structure 131 can comprise one tier or multiple tiers of dielectric material, and conductive structure 122 or conductive structure 132 can comprise one tier or multiple tiers of conductive material. In some examples, electronic component 110 comprises a component interconnect 111 coupled with conductive structure 132. Encapsulant 140 can be between electronic component 110 and substrate 130 and can cover a lateral side of component interconnect 111.

Substrate 120, substrate 130, encapsulant 140, encapsulant 150, interconnect structure 160, interconnect structure 170, external interconnect 180, dielectric structure 190 (optional), and metallization 191 (optional) can be referred to as an electronic package and can provide protection for electronic component 110 from external elements or environmental exposure. The electronic package can provide coupling to external electrical components through external interconnect 180.

FIG. 2 shows a cross-sectional view of an example electronic device 100A. In the example shown in FIG. 2, the electronic device 100A can be similar to electronic device 100 shown in FIG. 1 except that substrate 120A comprises dielectric structure 121A comprising a single tier of dielectric material, and substrate 120A comprises conductive structure 122A comprising a single tier of conductive material. In some examples, conductive structure 122A can comprise outward terminal 1224A as the single tier of conductive material. It should be noted that although a method of manufacturing electronic device 100A FIG. 2 is shown in and described with respect to FIGS. 3A through 3J below, electronic device 100 shown in FIG. 1 can also be manufactured by a similar manufacturing method.

Figures 3A, 3B:
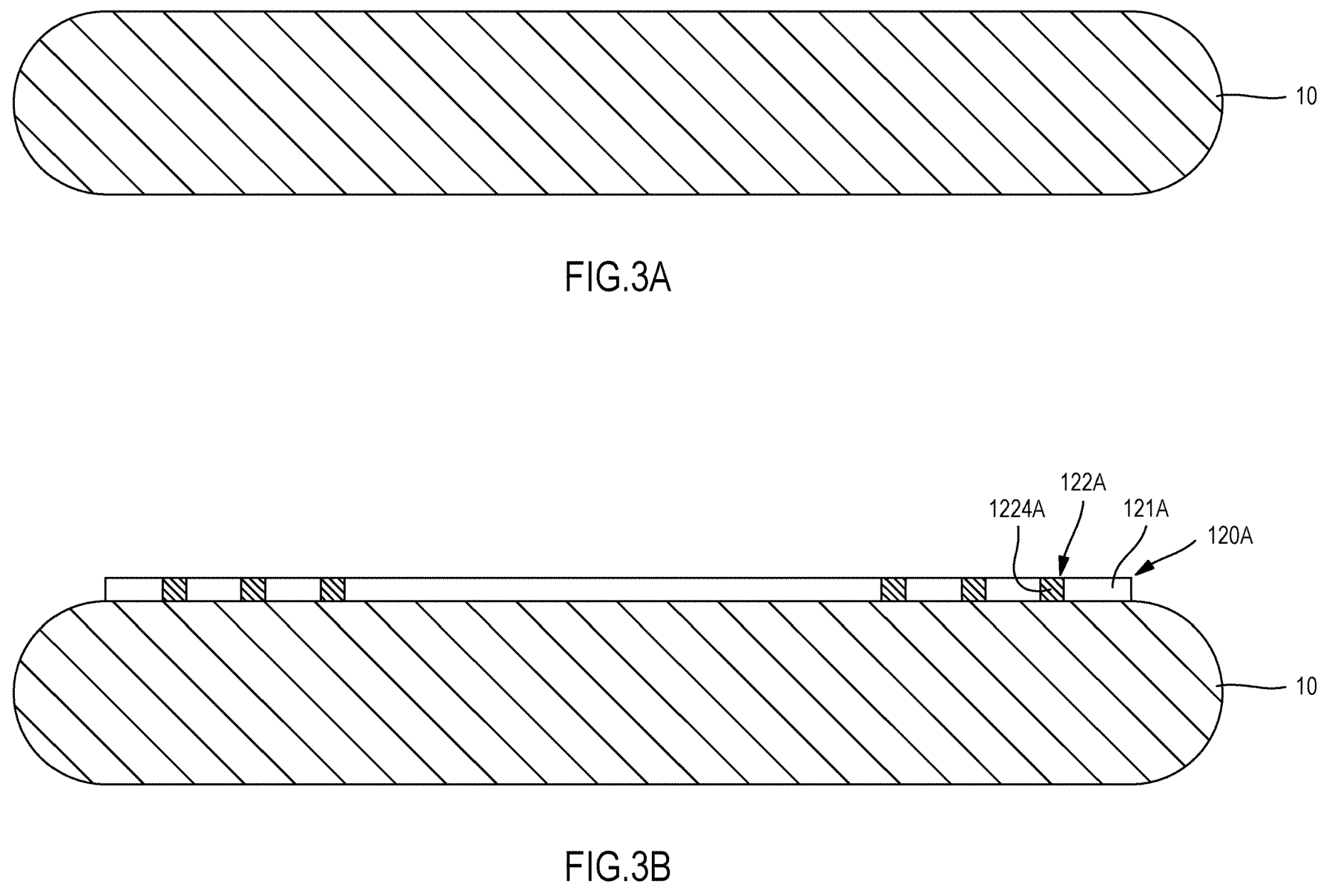
Figures 3C, 3D:
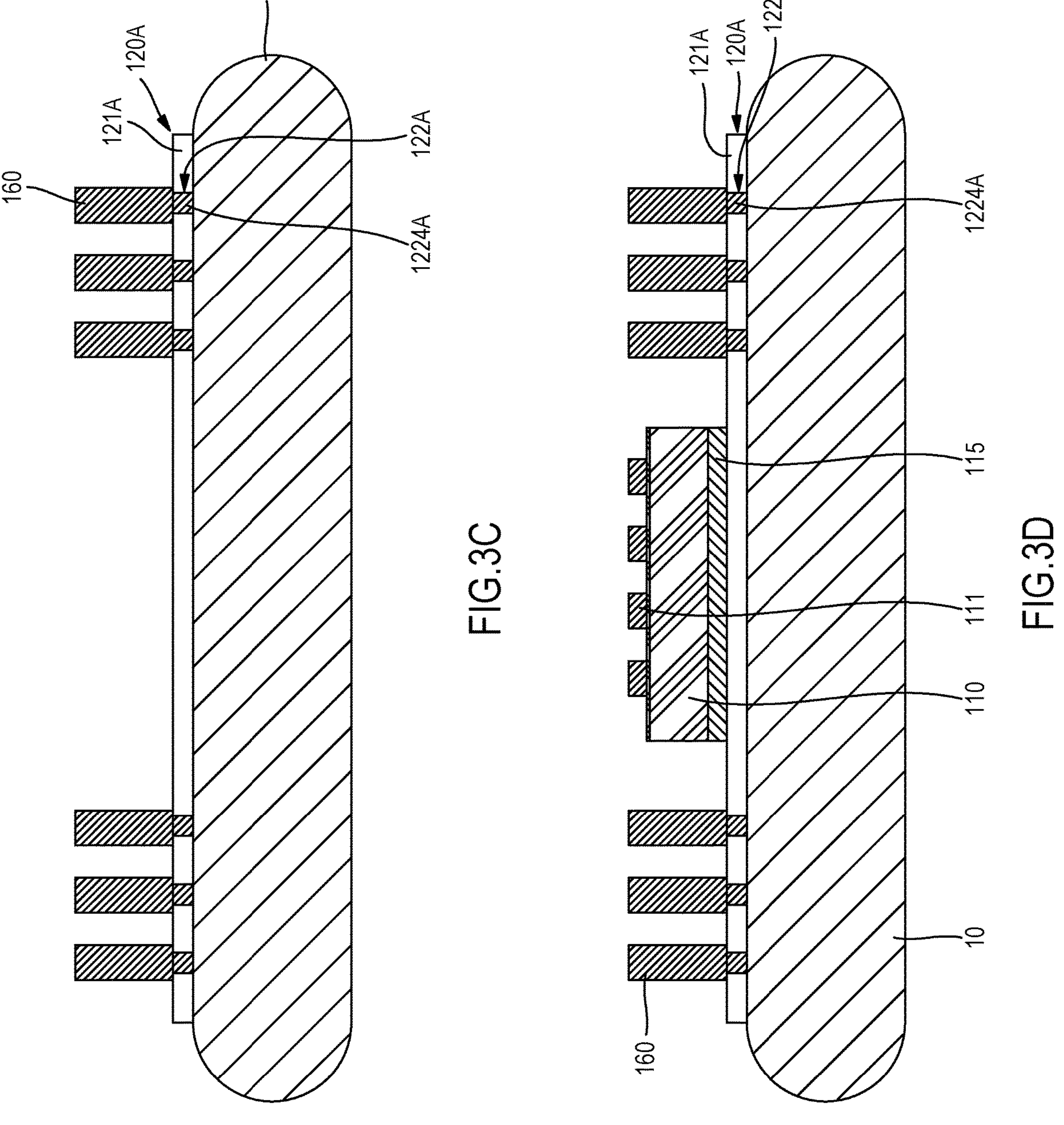

FIGS. 3A to 3J show cross-sectional views of an example method for manufacturing electronic device 100A. FIG. 3A shows a cross-sectional view of electronic device 100A at an early stage of manufacture. In the example shown in FIG. 3A, support carrier 10 can be provided. In some examples, support carrier 10 can be provided in the form of a circular wafer or a rectangular panel. In some examples, support carrier 10 can comprise silicon, glass, ceramic, or metal.

FIG. 3B shows a cross-sectional view of electronic device 100A at a later stage of manufacture. In the example shown in FIG. 3B, substrate 120A can be provided on support carrier 10. As described above, substrate 120A can comprise dielectric structure 121A and conductive structure 122A. In some examples, dielectric structure 121A can be provided on support carrier 10 in a first operation, and conductive structure 122A can be provided on support carrier 10 in a subsequent operation. In some examples, conductive structure 122A can be provided on support carrier 10 in a first operation, and dielectric structure 121A can provided on support carrier 10 in a subsequent operation. In some examples, dielectric structure 121A can comprise or be referred to as one or more dielectric layers or dielectric tiers. In some examples, dielectric structure 121A can be provided by coating, laminating, or depositing polyimide (PI), benzocyclobutene (BCB), polybenzoxazole (PBO), resin, or Ajinomoto build-up film (ABF) on support carrier 10. In some examples, conductive structure 122A can comprise or be referred to as one or more conductive layers, conductive tiers, traces, vias, pads, conductive paths, or under bump metals (UBMs). In some examples, conductive structure 122A can be provided by plating or depositing copper, a copper alloy, aluminum, an aluminum alloy, gold, a gold alloy, silver, a silver alloy, nickel, a nickel alloy, palladium, a palladium alloy, or tin silver. As described above, conductive structure 122A can comprise outward terminal 1224A. Outward terminal 1224A can comprise or be referred to as pad, land, or UBM. In some examples, a top side of outward terminal 1224A can be coplanar with a top side of dielectric structure 121A. In some examples, a bottom side of outward terminal 1224A can be coplanar with a bottom side of dielectric structure 121A. The thickness of substrate 120A comprising dielectric structure 121A and conductive structure 122A can range from about 2 micrometers (μm) to about 30 μm. Substrate 120A can support electronic component 110, encapsulant 140, or interconnect structure 160, and can couple interconnect structure 160 to an external device.

FIG. 3C shows a cross-sectional view of electronic device 100A at a later stage of manufacture. In the example shown in FIG. 3C, interconnect structure 160 can be provided on substrate 120A. In some examples, interconnect structure 160 can comprise a bottom side, lateral sides, and a top side. A portion of the bottom side of interconnect structure 160 can be coupled to outward terminal 1224A of conductive structure 122A while another portion of the bottom side of interconnect structure 160 can contact the top side of dielectric structure 121A. In some examples, interconnect structure 160 can be provided around electronic component 110, wherein electronic component 110 is provided at a later stage or operation. In some examples, a first set of one or more interconnect structures 160 can be provided on one lateral side of electronic component 110, and a second set of one or more interconnect structures 160 can be provided on another lateral side of electronic component 110, wherein electronic component 110 is provided at a later stage or operation. Interconnect structure 160 can comprise or be referred to as a pillar, a post, a Through Mold Via (TMV), a ball type structure such as a Copper Core solder Ball (CCB), a solder ball, or a Copper Cube Column (CCC), or a wire. In some examples, interconnect structure 160 can comprise copper, a copper alloy, aluminum, an aluminum alloy, gold, a gold alloy, silver, a silver alloy, nickel, a nickel alloy, palladium, a palladium alloy, or tin silver. Interconnect structure 160 can be provided in any of a variety of manners. In some examples, interconnect structure 160 can be plated on outward terminal 1224A of conductive structure 122A. In some examples, interconnect structure 160 can be printed and reflowed, or wire bonded. In some examples, the thickness of interconnect structure 160 can be greater than the thickness of electronic component 110 to be provided at a later stage. The thickness of interconnect structure 160 can range from about 38 μm to about 840 μm. The thickness of interconnect structure 160 can depend on the resolution of a photoresist used in a photolithography process, and the higher the resolution of the photoresist, the higher the thickness or height of interconnect structure 160 can be. Interconnect structure 160 can couple substrate 130, provided at a later stage, to substrate 120A.

FIG. 3D shows a cross-sectional view of electronic device 100A at a later stage of manufacture. In the example shown in FIG. 3D, electronic component 110 can be provided on substrate 120A. Electronic component 110 can be provided on a portion of substrate 120A devoid of interconnect structure 160. Electronic component 110 can comprise a top side, a bottom side opposite to the top side, and lateral sides connecting the top side and the bottom side. In some examples, the top side can comprise an active side and the bottom side can comprise an inactive side. In some examples, component interconnect 111 can be provided on the top side of electronic component 110, and component attach material 115 can be provided on the bottom side of electronic component 110. In some examples, electronic component 110 can be attached to substrate 120A through component attach material 115.

In some examples, electronic component 110 can comprise or be referred to as an electronic integrated circuit (EIC), a semiconductor die, a semiconductor chip, a semiconductor package, or build-up structure. In some examples, the die or chip can comprise an integrated circuit die separated from a semiconductor wafer. In some examples, electronic component 110 can comprise a transimpedance amplifier (TIA), a laser diode driver (LD-DRV), a digital signal processor (DSP), a network processor, a power management unit, an audio processor, a radio-frequency (RF) circuit, a wireless baseband system-on-chip (SoC) processor, a sensor, or an application specific integrated circuit (ASIC). The thickness of electronic component 110 can be less than the thickness of interconnect structure 160. The thickness of electronic component 110 can range from about 30 μm to about 780 μm.

In some examples, component interconnect 111 can comprise or be referred to as a bump, a pad, a pillar, a post, a Through Mold Via (TMV), a ball type structure (CCB or CCC), or a wire. In some examples, component interconnect 111 can comprise copper, a copper alloy, aluminum, an aluminum alloy, gold, a gold alloy, silver, a silver alloy, nickel, a nickel alloy, palladium, a palladium alloy, or tin silver. Component interconnect 111 can be provided in any of a variety of manners. In some examples, component interconnect 111 can be plated on the top side of electronic component 110. In some examples, component interconnect 111 can be printed and reflowed, or wire bonded. In some examples, the thickness of component interconnect 111 can be less than the thickness of interconnect structure 160. The thickness of component interconnect 111 can range from about 3 μm to about 35 μm. Component interconnect 111 can couple electronic component 110 to substrate 130 to be provided at a later stage.

In some examples, component attach material 115 can comprise or be referred to as an adhesive film or adhesive paste. In some examples, component attach material 115 can be first provided on the top side of substrate 120A, and then electronic component 110 can be attached on component attach material 115. In some examples, component attach material 115 can be first provided on the bottom side of electronic component 110, and then electronic component 110 can be attached on substrate 120A. The thickness of component attach material 115 can range from about 5 μm to about 25 μm. Component attach material 115 can stably fix electronic component 110 on substrate 120A.

Figures 3E, 3F:
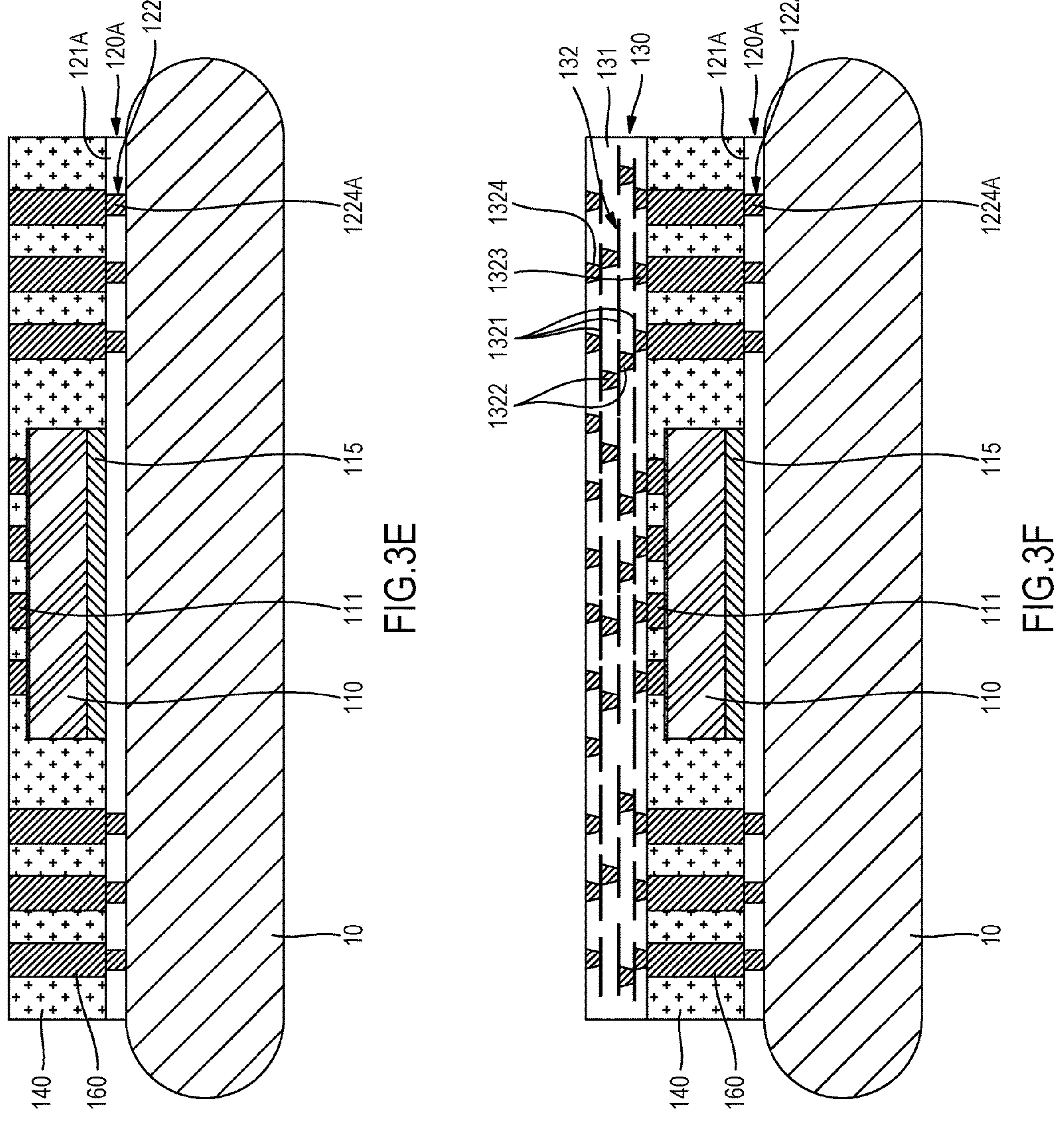

FIG. 3E shows a cross-sectional view of electronic device 100A at a later stage of manufacture. In the example shown in FIG. 3E, encapsulant 140 can be provided. In some examples, encapsulant 140 can surround, cover, or contact substrate 120A, interconnect structure 160, electronic component 110, component interconnect 111, or component attach material 115. In some examples, encapsulant 140 can cover the top side of substrate 120A. In some examples, encapsulant 140 can cover the top side or lateral side of interconnect structure 160. In some examples, encapsulant 140 can cover the top side or the lateral side of electronic component 110. In some examples, encapsulant 140 can cover the top side or the lateral side of component interconnect 111. In some examples, encapsulant 140 can cover the lateral side of component attach material 115. Encapsulant 140 can comprise or be referred to as epoxy molding compound, resin, filler-reinforced polymer, B-stage pressed film, or gel. In some examples, encapsulant 140 can comprise an epoxy resin or a phenol resin, carbon black, or a silica filler. In some examples, encapsulant 140 can be provided by compression molding, transfer molding, liquid encapsulant molding, vacuum lamination, paste printing, or film assist molding. Compression molding can be a process of supplying a fluid resin into a mold in advance and then putting an electronic component into the mold to cure the fluid resin, and transfer molding can be a process of curing by supplying a fluid resin from a gate or supply port of a mold to the periphery of a corresponding electronic component. The thickness of encapsulant 140 can range from about 38 μm to about 840 μm. Encapsulant 140 can protect electronic component 110 and interconnect structure 160 from external factors or environmental exposure, and can quickly dissipate heat from electronic component 110.

In some examples, encapsulant 140 can be provided to a thickness greater than ultimately desired. In such examples, grinding, or otherwise thinning or planarizing, can be performed to encapsulant 140. In the example shown in FIG. 3E, encapsulant 140 has been ground to result in encapsulant 140. The top surface of the grinded, or thinned or planarized, encapsulant 140 can be coplanar with the top surface of interconnect structure 160 or component interconnect 111, wherein the top surface of interconnect structure 160 or the top surface of component interconnect 111 are exposed from encapsulant 140.

FIG. 3F shows a cross-sectional view of electronic device 100A at a later stage of manufacture. In the example shown in FIG. 3F, substrate 130 can be provided on electronic component 110, encapsulant 140, and interconnect structure 160. As described above, substrate 130 can comprise dielectric structure 131 and conductive structure 132. In some examples, dielectric structure 131 can be provided over or in contact with the top side, or top surface, of encapsulant 140, or the top side, or top surface, of interconnect structure 160. In some examples, dielectric structure 131 can be provided over or in contact with the top side, or top surface, of encapsulant 140, or the top side, or top surface, of component interconnect 111. In some examples, dielectric structure 131 can be provided, and conductive structure 132 subsequently can be provided. In some examples, conductive structure 132 can be provided, and dielectric structure 131 subsequently can be provided. In some examples, dielectric structure 131 and conductive structure 132 can comprise a multilayer structure. In some examples, conductive structures 132 can be interleaved between dielectric structures 131. In some examples, dielectric structures 131 can be interleaved between conductive structures 132. In some examples, dielectric structure 131 can comprise or be referred to as one or more dielectric layers or dielectric tiers. In some examples, dielectric structure 131 can be provided by coating, laminating, or depositing PI, BCB, PBO, resin, or ABF. In some examples, conductive structures 132 can comprise or be referred to as one or more conductive layers, traces, vias, pads, conductive paths, or UBMs. In some examples, conductive structures 132 can be provided by plating or depositing copper, a copper alloy, aluminum, an aluminum alloy, gold, a gold alloy, silver, a silver alloy, nickel, a nickel alloy, palladium, a palladium alloy, or tin silver.

As described above, conductive structure 132 can comprise trace 1321, via 1322, inward terminal 1323, or outward terminal 1324. In some examples, trace 1321 can comprise or be referred to as an RDL pattern or a horizontal pattern, and can carry an electrical signal in a horizontal direction. The thickness of trace 1321 can range from about 2 μm to about 30 μm. In some examples, via 1322 can comprise or be referred to as an RDL pattern or a vertical pattern, and can carry an electrical signal in a vertical direction. The thickness of via 1322 can range from about 2 μm to about 30 μm. The diameter of via 1322 can range from about 2 μm to about 300 μm. Via 1322 can couple upper traces and lower traces. The thickness of inward terminal 1323 can range from about 2 μm to about 30 μm. The diameter of inward terminal 1323 can range from about 2 μm to about 300 μm. One or more of inward terminals 1323 can be coupled to interconnect structure 160. One or more of inward terminals 1323 can be coupled to component interconnect 111. In some examples, a top side of outward terminal 1324 can be coplanar with a top side of dielectric structure 131. The thickness of outward terminal 1324 can range from about 2 μm to about 30 μm. The diameter of outward terminal 1324 can range from about 2 μm to about 300 μm. Outward terminal 1324 can be coupled to interconnect structure 170 to be provided at a later stage.

The total thickness of substrate 130 comprising dielectric structures 131 and conductive structures 132 can range from about 24 μm to about 360 μm. In some examples, substrate 130 can couple interconnect structure 160 to interconnect structure 170, wherein interconnect structure 170 is provided at a later stage or operation.

In some examples, substrate 130 can comprise a single-layer or single tier structure similar to substrate 120A. In some examples, substrate 130 can comprise multilayer or multi-tier structures similar to substrate 120.

In some examples, substrate 120 or substrate 130 can comprise one or more conductive redistribution layers and one or more dielectric layers or dielectric tiers that can be formed layer by layer over an electronic device to which the RDL substrate is to be coupled, or can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process that can include one or more dielectric layers or dielectric tiers alternatingly stacked with one or more conductive layers that define respective conductive redistribution patterns or traces configured collectively to fan-out electrical traces outside the footprint of the electronic device, or to fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers or dielectric tiers of the RDL substrate can be patterned with a photo-patterning process, and can include a photolithographic mask through which light is exposed to photo-pattern desired features such as vias in the dielectric layers or dielectric tiers. Thus, the dielectric layers or dielectric tiers can be made from photo-definable organic dielectric materials such as, for example, polyimide (PI), benzocyclobutene (BCB), polybenzoxazole (PBO), resin, or Ajinomoto Build-up Film (ABF). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers or dielectric tiers. Some examples of one or more inorganic dielectric layers or dielectric tiers can comprise silicon nitride (Si3N4), silicon oxide (SiO2), or silicon oxynitride (SiON). The one or more inorganic dielectric layers or dielectric tiers can be formed by growing the inorganic dielectric layers or dielectric tiers using an oxidation or nitridization process instead using photo-defined organic dielectric materials. Such inorganic dielectric layers or dielectric tiers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate.

Figures 3G, 3H:
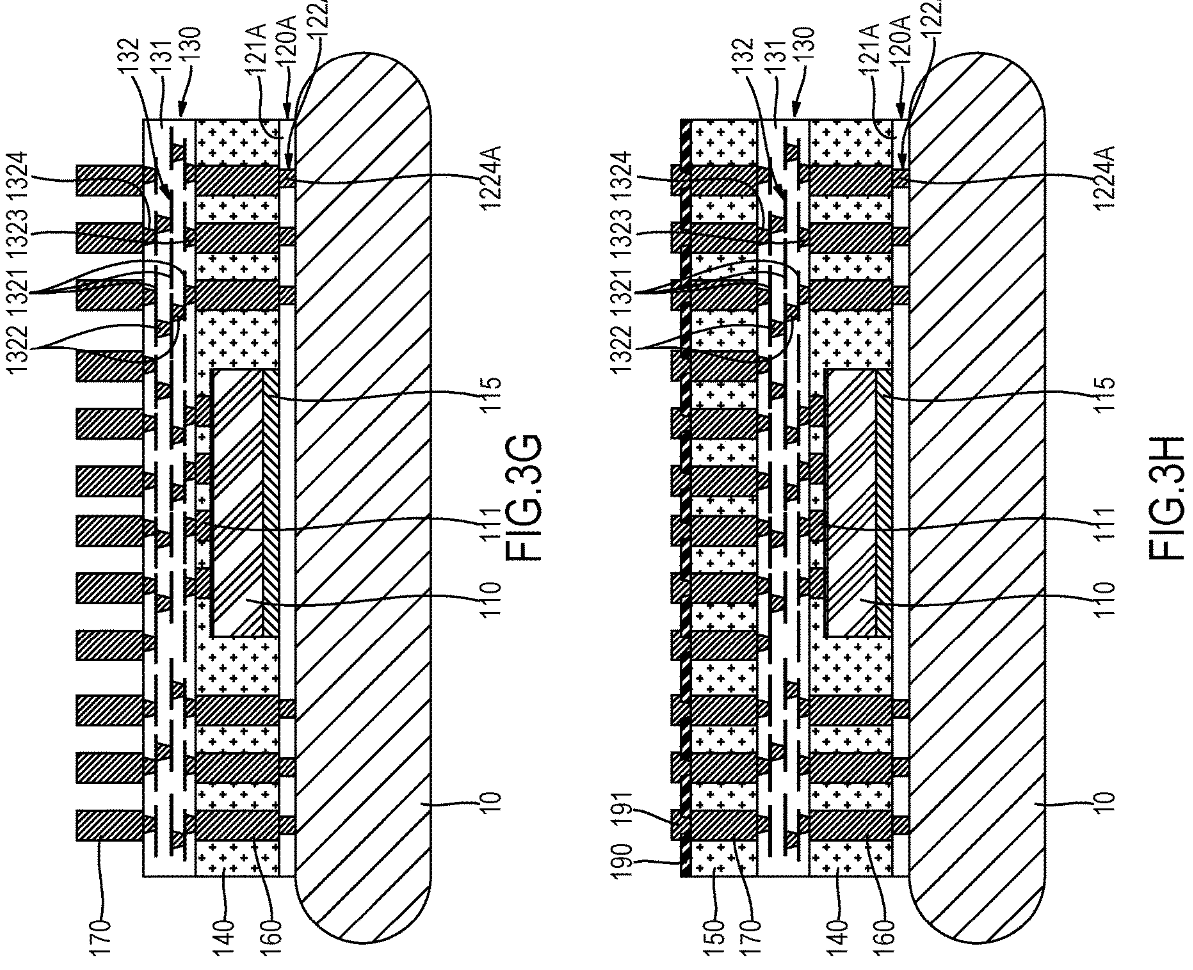

FIG. 3G shows a cross-sectional view of electronic device 100A at a later stage of manufacture. In the example shown in FIG. 3G, interconnect structure 170 can be provided on substrate 130. In some examples, interconnect structure 170 can comprise a bottom side, a top side opposite to the bottom side, and lateral sides connecting the bottom side and the top side. A portion of the bottom side of interconnect structure 170 can be coupled to outward terminal 1324 of conductive structure 132 while another portion of the bottom side of interconnect structure 170 can contact the top side of dielectric structure 131. In some examples, interconnect structure 170 can be arranged on the top side of substrate 130. Interconnect structure 170 can comprise or be referred to as a pillar, a post, a TMV, a ball type structure (CCB or CCC), or wire. In some examples, interconnect structure 170 can comprise copper, a copper alloy, aluminum, an aluminum alloy, gold, a gold alloy, silver, a silver alloy, nickel, a nickel alloy, palladium, a palladium alloy, or tin silver. Interconnect structure 170 can be provided in any of a variety of manners.

In some examples, interconnect structure 170 can be plated on outward terminal 1324 of conductive structure 132. In some examples, interconnect structure 170 can be printed and reflowed, or wire bonded. The thickness of interconnect structure 170 can range from about 38 μm to about 840 μm. The thickness of interconnect structure 170 can depend on the resolution of a photoresist used in a photolithography process, and the higher the resolution of the photoresist, the higher the thickness or height of interconnect structure 170 can be. Interconnect structure 170 can couple an external device, for example a Photonic Integrated Circuit (PIC) to be provided at a later stage or operation, to RDL substrate 170.

Figures 4, 5:
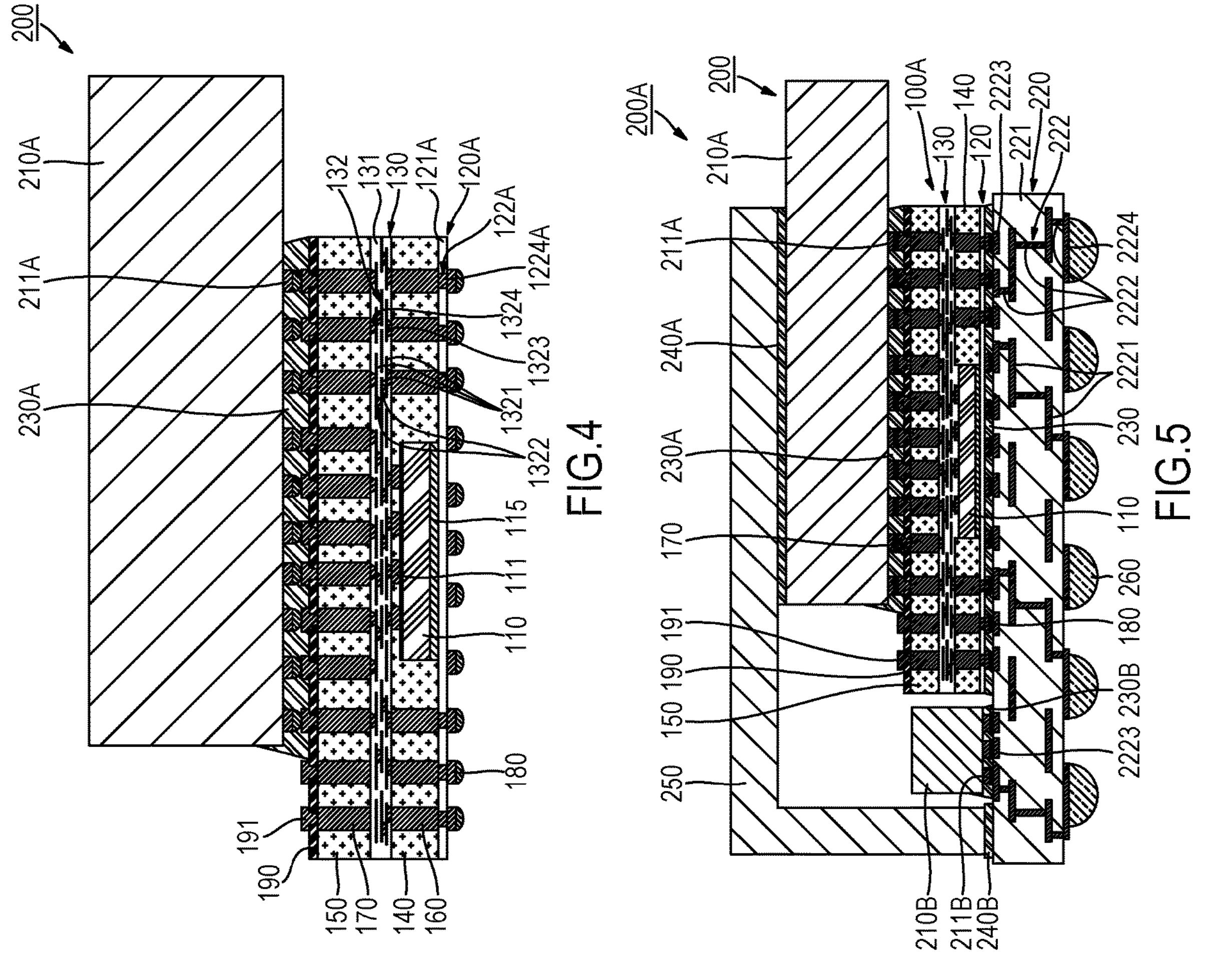
FIG. 4 shows a cross-sectional view of an example electronic device.
FIG. 5 shows a cross-sectional view of an example electronic device.

FIG. 3H shows a cross-sectional view of electronic device 100A at a later stage of manufacture. In the example shown in FIG. 3H, encapsulant 150 can be provided. In some examples, encapsulant 150 can surround, cover, or contact substrate 130 or interconnect structure 170. In some examples, encapsulant 150 can cover the top side of substrate 120A. In some examples, encapsulant 150 can cover the top side or lateral side of interconnect structure 170. Encapsulant 150 can comprise or be referred to as epoxy molding compound, resin, filler-reinforced polymer, B-stage pressed film, or gel. In some examples, encapsulant 150 can comprise an epoxy resin or a phenol resin, carbon black, or a silica filler. In some examples, encapsulant 150 can be provided by compression molding, transfer molding, liquid encapsulant molding, vacuum lamination, paste printing, or film assist molding. The thickness of encapsulant 150 can range from about 38 μm to about 840 μm. Encapsulant 150 can protect substrate 130 and interconnect structure 170 from external factors or environmental exposure. In some examples, encapsulant 140 can contain electronic component 110 and encapsulant 150 can be devoid of electronic components. In some examples where an electronic component such as a PIC is coupled to the top side of interconnect structure 170 in an overhanging fan-out structure, chipping or cracking of substrate 130 can be mitigated or prevented by encapsulant 150. Since double molding structures are provided on the top side of substrate 130 and bottom side of substrate 130 respectively, the rigidity of substrate 130 can be reinforced, and thus chipping or cracking of substrate 130 can be mitigated or prevented. An example where electronic component is coupled to interconnect structure 170 in the overhanging fan-out structure is shown in FIG. 4, and will be described in detail below.

In some examples, encapsulant 150 can be initially provided at a thickness greater than ultimately desired. In such examples, grinding, or otherwise thinning or planarizing, can be performed to encapsulant 150 to provide the desired thickness. In the example shown in FIG. 3H, encapsulant 150 has been ground to result in encapsulant 150. The top side of the grinded, or thinned or planarized, encapsulant 150 can be coplanar with the top surfaces of interconnect structure 170, and the top sides of interconnect structure 170 are exposed from encapsulant 150.

In some examples, dielectric 190 and a metallization 191 can be provided on the top side of interconnect structure 170 exposed through encapsulant 150. In some examples, a material such as a copper-nickel-gold (Cu/Ni/Au) alloy, a copper-nickel-soler (Cu/Ni/Cu/Solder) alloy, a copper-solder (Cu/Solder) alloy, Organic Solderability Preservatives (Cu/OSP), Electroless Nickel/Immersion Gold (Cu/ENIG), Electroless Nickel/Electroless Palladium/Immersion Gold Cu/Immersion Silver (Cu/ENEPIG), or Cu/Immersion Tin can optionally be provided on the top side of interconnect structure 170.

Figures 3I, 3J:
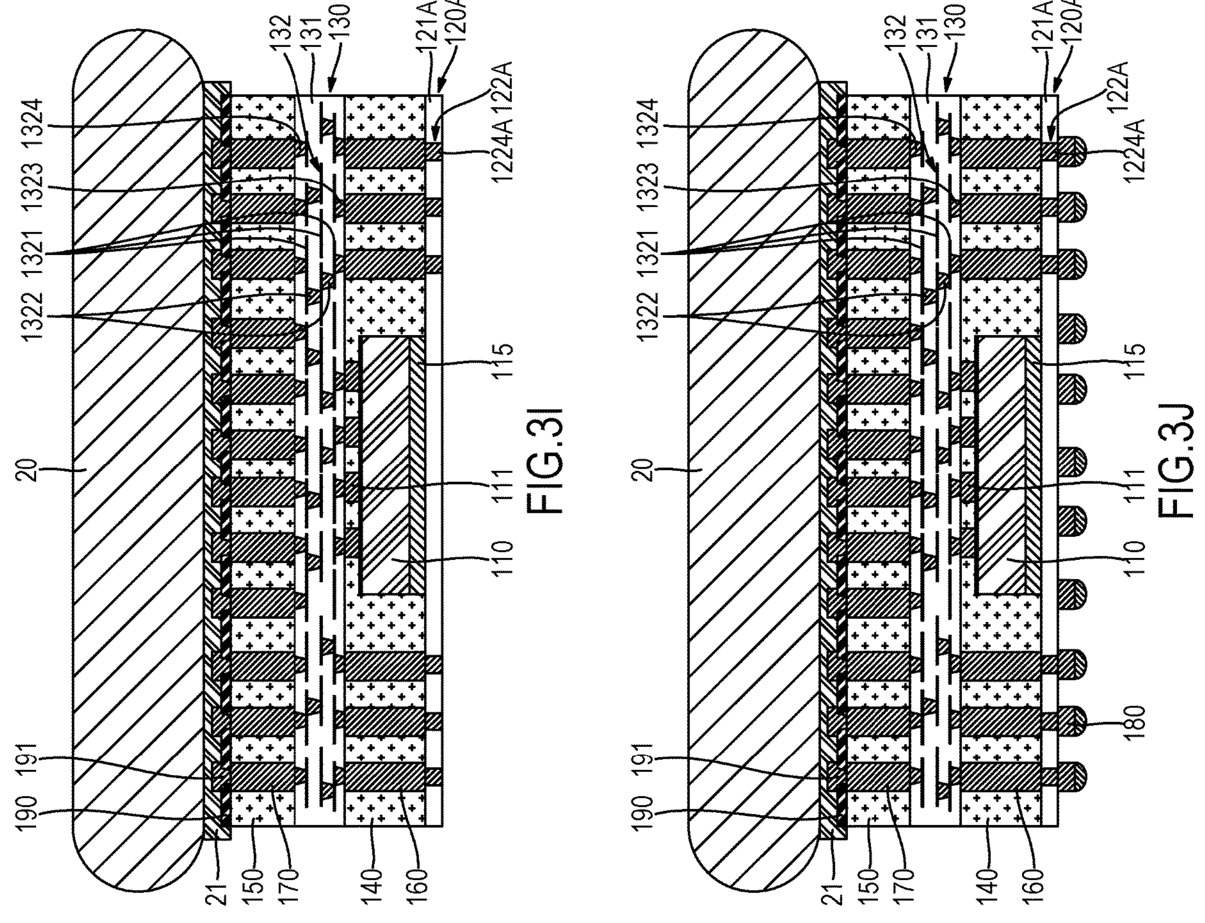

FIG. 3I shows a cross-sectional view of electronic device 100A at a later stage of manufacture. In the example shown in FIG. 3I, support carrier 20 can be provided and support carrier 10 can be removed. In some examples, support carrier 20 can be referred to as wafer support system. In some examples, wafer support system 20 can be attached to encapsulant 150 or interconnect structure 170 through temporary adhesive 21. Temporary adhesive 21 can later lose adhesion due to heat or light. Support carrier 10 can be removed in any of a variety of manners. In some examples, support carrier 10 can be removed from substrate 120A by grinding or etching. In some examples, if a temporary adhesive loses adhesion due to heat or light is interposed between support carrier 10 and substrate 120A, support carrier 10 can be removed from substrate 120A by providing heat or light. In some examples, support carrier 10 can be forcibly separated from substrate 120A. After removing support carrier 10, dielectric structure 121A and outward terminal 1224A of substrate 120A can be exposed (optional).

FIG. 3J shows a cross-sectional view of electronic device 100A at a later stage of manufacture. In the example shown in FIG. 3J, external interconnect 180 can be provided on substrate 120A. In some examples, external interconnect 180 can be coupled to the bottom side of outward terminal 1224A. In some examples, external interconnect 180 can comprise a top side, a bottom side opposite to the top side, and lateral side connecting to the top and bottom sides. In some examples, a portion of the top side of external interconnect 180 can be coupled to the bottom side of outward terminal 1224A while another portion of the top side of external interconnect 180 can contact the bottom side of dielectric structure 121A. In some examples, external interconnect 180 can comprise or be referred to as a pillar, a post, a pad, a bump, a solder bump, a solder ball, or a pillar with a solder cap. In some examples, external interconnect 180 can comprise tin, silver, lead, copper, Sn—Pb, $Sn_{37}$—Pb, $Sn_{95}$—Pb, Sn—Pb—Ag, Sn—Cu, Sn—Ag, Sn—Au, Sn—Bi, or Sn—Ag—Cu. In some examples, the thickness of external interconnects 180 can range from about 20 μm to about 600 μm. External interconnects 180 can serve to couple electronic device 100A to an external device.

In some examples, a singulation process optionally can be performed. In some examples, the singulation process can be performed by means of a cutting wheel or a laser beam. In some examples, when multiple electronic devices 100A are manufactured in a form having rows or columns, multiple combined electronic devices 100A can be separated into individual electronic devices 100A by a singulation or sawing process. In some examples, individual electronic devices 100A can be provided by sawing through substrate 120A, encapsulant 140, substrate 130, and encapsulant 150 using the cutting wheel. Accordingly, lateral sides of substrate 120A, encapsulant 140, substrate 130, and encapsulant 150 can be coplanar.

FIG. 4 shows a cross-sectional view of an example electronic device 200. In the example shown in FIG. 4, electronic device 200 can comprise electronic component 110, substrate 120A, substrate 130, encapsulant 140, encapsulant 150, interconnect structure 160, interconnect structure 170, external interconnect 180, and electronic component 210A. In some examples, electronic component 210A can comprise or be referred to as a photonic integrated circuit (PIC), an integrated optical circuit, a semiconductor die, a semiconductor chip, a semiconductor package, or build-up structure. The thickness of electronic component 210A can range from about 20 μm to about 1000 μm. In some examples, photonic integrated circuit or integrated optical circuit 210A can be a microchip containing two or more photonic components forming a functioning circuit. Photonic integrated circuit 210A can detect, generate, receive, transport, or process light. Photonic integrated circuit 210A can utilize photons or particles or beams of light as opposed to electrons that can be utilized by electronic integrated circuit. Photonic integrated circuit 210A can provide functions for information signals using optical wavelengths, typically in the visible spectrum or near infrared. In some examples, photonic integrated circuit 210A can be over encapsulant 150 and can be coupled with interconnect structure 170. Encapsulant 150 can be devoid of any electronic components.

In some examples, electronic component 210A can comprise component interconnect 211A. In some examples, component interconnect 211A can comprise or be referred to as a bump, a pad, a pillar, a post, a ball type structure (CCB, CCC), or a wire. In some examples, component interconnect 211A can comprise Cu/Solder alloy, Cu/Ni/Cu/Solder alloy, or Cu/Ni/Solder alloy. Component interconnect 211A can be provided in any of a variety of manners. In some examples, component interconnect 211A can be plated on the bottom side of electronic component 210A. In some examples, component interconnect 211A can be printed and reflowed, or wire bonded. The thickness of component interconnect 211A can range from about 20 μm to about 300 μm. Component interconnect 211A can couple electronic component 210A to metallization 191 through solder. In some examples, underfill 230A can be provided or interposed between component interconnect 211A and dielectric 190. In some examples, underfill 230A can comprise or be referred to as capillary underfill (CUF), non-conductive pasted (NCP), non-conductive film (NCF), or anisotropic conductive film (ACF). In some examples, underfill 230A can be injected into a gap between electronic component 210A and dielectric 190 after electronic component 210A is coupled to metallization 191. In some examples, underfill 230A can be pre-coated onto dielectric 190 prior to electronic component 210A being coupled to metallization 191. Accordingly, component interconnect 211A can penetrate underfill 230A to be coupled to metallization 191. In some examples, underfill 230A can be pre-coated on electronic component 210A prior to electronic component 210A being coupled to metallization 191. Accordingly, electronic component 210A can pressurize underfill 230A, and at the same time component interconnect 211A can be coupled to metallization 191. In some examples, a curing process of underfill 230A can be performed, for example using a thermal curing process or a photocuring process.

In some examples, as shown in FIG. 4, electronic component 210A can be coupled to metallization 191 in an overhanging configuration. In some examples, electronic component 210A is over a first portion encapsulant 150, and a second portion of encapsulant 150 is uncovered by second electronic component 210A. In some examples, a portion of electronic component 210A extends beyond a lateral side of encapsulant 150. In some examples, an optical fiber can be coupled to electronic component 210A, for example to the extended portion of electronic component 210A. In some examples, another portion of electronic component 210A can be located over dielectric 190. In some examples, dielectric 190 can be over encapsulant 150 and can be between encapsulant 150 and electronic component 210A. In some examples, external interconnect 180 can be provided after electronic component 210A are coupled to metallization 191, for example where external interconnect 180 is provided by solder ball attachment. In some examples where there is an overhanging arrangement of electronic component 210A, encapsulant 150 is on the top side of substrate 130 and encapsulant 140 is on the bottom side of substrate 130 in order to prevent or mitigate chipping or cracking of substrate 130. In some examples, metallization 191 can be coupled between component interconnect 211A and interconnect structure 170. In some examples, dielectric 190 covers a lateral side of the metallization 191, and a portion of metallization 191 is exposed from dielectric 190. In some examples, electronic device 200 can be referred to as an optic engine structure for co-packaged optics (CPO). In some examples, connect component 211A can have one or more grooves or receptacles on one or more sides to couple with one or more optical fibers, optical cables, optical waveguides, or optical transmission lines.

FIG. 5 shows a cross-sectional view of an example electronic device 200A. In the example shown in FIG. 5, electronic device 200A can comprise connect component 210B, base substrate 220, underfill material 230A, underfill material 230B, lid 250, and base interconnect 260 in addition to electronic device 200 as shown in FIG. 4. In some examples, electronic device 100 or 100A first can be coupled to base substrate 220, and then electronic component 210A subsequently can be coupled to electronic device 100 or 100A as an optional process flow.

Connect component 210B can comprise or be referred to as a Clock and Data recovery (CDR). The thickness of connect component 210B can range from about 20 μm to about 1000 μm. In some examples, connect component 210B can comprise component interconnect 211B. In some examples, component interconnect 211B can comprise or be referred to as a bump, a pad, a pillar, a post, a ball type structure (CCB, CCC), or a wire. In some examples, component interconnect 211B can comprise copper, a copper alloy, a copper/solder alloy, a solder alloy, aluminum, an aluminum alloy, gold, a gold alloy, silver, a silver alloy, nickel, a nickel alloy, palladium, a palladium alloy, or tin silver. Component interconnect 211B can be provided in any of a variety of manners. In some examples, component interconnect 211B can be plated on the bottom side of connect component 210B. In some examples, component interconnect 211B can be printed and reflowed, or wire bonded. The thickness of component interconnect 211B can range from about 1 μm to about 600 μm. Component interconnect 211B can allow connect component 210B to be coupled to base substrate 220. In some examples, connect component 210 can be on or over the top side of base substrate 220, and connect component 210 can be coupled with conductive structure 222.

Base substrate 220 can comprise dielectric structure 221 and conductive structure 222. In some examples, substrate 120 and substrate 130 are over base substrate 220, and conductive structure 222 is coupled with conductive structure 122. In some examples, dielectric structure 221 can comprise one or more dielectric layers or dielectric tiers. The dielectric layers or dielectric tiers can comprise one or more layers or tiers of dielectric materials interleaved with the layers or tiers of the conductive structures. In some examples, the dielectric materials can comprise PI, BCB, PBO, resin, or ABF. In some examples, conductive structure 222 can comprise one or more conductive layers defining signal distribution elements, for example traces, vias, pads, conductive paths, or UBM. Conductive structure 222 can comprise traces 2221, vias 2222, inward terminals 2223, and outward terminals 2224. In some examples, trace 2221 can comprise or be referred to as a pattern or a horizontal pattern, and can carry an electrical signal in a horizontal direction.

The thickness of trace 2221 can range from about 3 μm to about 30 μm. In some examples, via 2222 can comprise or be referred to as a pattern or a vertical pattern, and can carry an electrical signal in a vertical direction. The thickness via 2222 can range from about 3 μm to about 1200 μm. The diameter of via 2222 can range from about 20 μm to about 500 μm. Via 2222 can couple upper and lower traces. In some examples, inward terminal 2223 can comprise or be referred to as a pad, a land, an UBM, or a stud. The thickness of inward terminal 2223 can range from about 5 μm to about 30 μm. The diameter of inward terminal 2223 can range from about 20 μm to about 200 μm. Outward terminal 2224 can comprise or be referred to as a pad, a land, UBM, or a stud. The thickness of outward terminal 2224 can range from about 5 μm to about 30 μm. The diameter of outward terminal 2224 can range from about 100 μm to 1000 μm.

In some examples, base substrate 220 can be a pre-formed substrate. The pre-formed substrate can be manufactured prior to attachment to an electronic device and can comprise dielectric layers or dielectric tiers between respective conductive layers or conductive tiers. The conductive layers or conductive tiers can comprise copper and can be formed using an electroplating process. The dielectric layers or dielectric tiers can be relatively thicker non-photo-definable layers and can be attached as a pre-formed film rather than as a liquid and can include a resin with fillers such as strands, weaves, or other inorganic particles for rigidity or structural support. Since the dielectric layers or dielectric tiers are non-photo-definable, features such as vias or openings can be formed by using a drill or laser. In some examples, the dielectric layers or dielectric tiers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate omitting the permanent core structure, and the dielectric and conductive layers can be formed on a sacrificial carrier and is removed after formation of the dielectric and conductive layers and before attachment to the electronic device. The pre-formed substrate can be referred to as a printed circuit board (PCB) or a laminate substrate. Such pre-formed substrate can be formed through a semi-additive or modified-semi-additive process.

In some examples, external interconnects 180 of electronic device 200 can be coupled to one or more of inward terminals 2223 of base substrate 220. In some examples, component interconnects 211B of connect component 210B can be coupled to one or more of inward terminals 2223 of base substrate 220.

In some examples, underfill material 230 can be provided between electronic device 200 and base substrate 220. In some examples, underfill material 230B can be provided between connect component 210B and base substrate 220.

Base interconnect 260 can comprise solder balls, bumps, pad, or pillar. Base interconnect 260 can be coupled to outward terminal 2224 of base substrate 220. In some examples, a land grid array (LGA) also can be an example design.

In some examples, lid 250 can be provided on or over electronic component 210A and base substrate 220 through thermal adhesive 240A and thermal adhesive 240B. In some examples, lid 250 can be coupled to the top side of base substrate 220 with thermal adhesive 240*b*, and lid can be coupled to the top side of electronic component 210A with thermal adhesive 240A. A portion of electronic component 210A can extend beyond a lateral side of lid 250. Lid 250 can comprise or be referred to as a heat spreader, cover, case, or housing. Lid 250 can comprise aluminum, an aluminum alloy, copper, or a copper alloy. The thickness of lid 250 can range from about 0.1 millimeter (mm) to about 10 mm. Lid 250 not only can dissipate heat from electronic device 200A, but also can protect electronic device 200A from the external environment.

The present disclosure includes reference to certain examples. It will be understood by those skilled in the art, however, that various changes may be made and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. An electronic device, comprising:

a first substrate comprising a first dielectric structure and a first conductive structure;

a first electronic component over the first substrate, wherein the first electronic component is coupled with a top side of the first substrate with a die attach material and the die attach material contacts a majority of a bottom side of the first electronic component;

a second substrate comprising a second dielectric structure and a second conductive structure, wherein the second substrate is over the first substrate and the first electronic component;

a first interconnect structure between the first substrate and the second substrate, wherein the first interconnect structure is coupled with the first conductive structure and the second conductive structure;

a first encapsulant between the first substrate and the second substrate and covering a lateral side of the first interconnect structure, a lateral side of the die attach material, and a lateral side of the first electronic component, wherein the first interconnect structure is outside of a central area of the first encapsulant and between the lateral side of the first electronic component and an exterior lateral side of the first encapsulant and wherein the first encapsulant extends between a top side of the first electronic component and the bottom side of the second substrate;

a second interconnect structure over the second substrate and coupled with the second conductive structure;

a second encapsulant over the second substrate and covering a lateral side of the second interconnect structure; and a second electronic component over the second encapsulant, wherein the second electronic component is coupled with the second interconnect structure, and wherein the second electronic component comprises a photonic integrated circuit (PIC).

2. The electronic device of claim 1, wherein:

the second encapsulant is devoid of electronic components.

3. The electronic device of claim 1, wherein:

the second electronic component is over a first portion of the second encapsulant, and a second portion of the second encapsulant is uncovered by the second electronic component.

4. The electronic device of claim 1, comprising:

a dielectric over the second encapsulant and between the second encapsulant and the second electronic component;

wherein the dielectric covers an entirety of a top side of the second encapsulant.

5. The electronic device of claim 4, comprising:

a metallization coupled between a component interconnect of the second electronic component and the second interconnect structure;

wherein the dielectric covers a lateral side of the metallization; and a portion of the metallization is exposed from the dielectric.

6. The electronic device of claim 1, wherein:

the first dielectric structure comprises a single dielectric tier; and the first conductive structure comprises a single conductive tier in the single dielectric tier, wherein the single conductive tier comprises an outward terminal.

7. The electronic device of claim 1, wherein:

the first dielectric structure comprises a plurality of dielectric tiers; and the first conductive structure comprises a plurality of conductive tiers in the plurality of dielectric tiers.

8. The electronic device of claim 1, wherein:

a first portion of the second electronic component extends beyond an exterior lateral side of the second encapsulant; and the first portion of the second electronic component is non-overlapping with the second encapsulant.

9. The electronic device of claim 1, wherein:

the first electronic component comprises a component interconnect coupled with the second conductive structure; and the first encapsulant is between the first electronic component and the second substrate and covers a lateral side of the component interconnect.

10. The electronic device of claim 1, wherein:

at least one of the first substrate or the second substrate comprises a redistribution layer (RDL) substrate.

11. The electronic device of claim 1, comprising:

a base substrate comprising a base substrate dielectric structure and a base substrate conductive structure;

wherein:

the first substrate and the second substrate are over the base substrate; and the base substrate conductive structure is coupled with the first conductive structure.

12. The electronic device of claim 11, comprising:

a lid over the second electronic component;

wherein the lid is coupled with a top side of the second electronic component and a top side of the base substrate.

13. The electronic device of claim 12, wherein:

a first portion of the second electronic component extends beyond an exterior lateral side of the lid;

wherein the first portion of the second electronic component is non-overlapping with the lid.

14. The electronic device of claim 11, comprising:

a third electronic component over a top side of the base substrate;

wherein the third electronic component is coupled with the base substrate conductive structure.

15. The electronic device of claim 11, wherein:

the base substrate comprises a pre-formed substrate.

16. A method to manufacture an electronic component, comprising:

providing a first substrate comprising a first dielectric structure and a first conductive structure, wherein the first conductive structure comprises an outward terminal;

providing a first interconnect structure over the first substrate, wherein the first interconnect structure is coupled with the first conductive structure;

providing a first electronic component over the first substrate, wherein the first electronic component is coupled with a top side of the first substrate with a die attach material and the die attach material contacts a majority of a bottom side of the first electronic component;

providing a first encapsulant over the first substrate and covering a lateral side of the first interconnect structure, a lateral side of the die attach material, and a lateral side of the first electronic component;

providing a second substrate comprising a second dielectric structure and a second conductive structure, wherein the second substrate is over the first substrate and the first electronic component, and the second conductive structure is coupled with the first interconnect structure;

providing a second interconnect structure over the second substrate and coupled with the second conductive structure;

providing a second encapsulant over the second substrate and covering a lateral side of the second interconnect structure; and providing a second electronic component over the second encapsulant;

wherein the second electronic component is coupled with the second interconnect structure;

wherein the first encapsulant is between the first electronic component and the second substrate; and wherein the first interconnect structure is outside of a central area of the first encapsulant and between the lateral side of the first electronic component and an exterior lateral side of the first encapsulant and wherein the first encapsulant extends between a top side of the first electronic component and the bottom side of the second substrate.

17. The method of claim 16, wherein:

the second electronic component is over a first portion of the second encapsulant, and a second portion of the second encapsulant is uncovered by the second electronic component.

18. The method of claim 16, wherein:

a first portion of the second electronic component extends beyond an exterior lateral side of the second encapsulant;

wherein the first portion of the second electronic component is non-overlapping with the second encapsulant.

19. The method of claim 16, comprising:

providing a base substrate comprising a base substrate dielectric structure and a base substrate conductive structure, wherein the base substrate conductive structure comprises an inward terminal;

wherein:

the first substrate and the second substrate are over the base substrate; and the inward terminal of the base substrate conductive structure is coupled with the outward terminal of the first conductive structure.

20. The method of claim 19, comprising:

providing a lid over the second electronic component;

wherein the lid is coupled with a top side of the second electronic component and a top side of the base substrate.

* * * * *